(12) United States Patent
Lehr et al.

(10) Patent No.: US 7,592,258 B2
(45) Date of Patent: Sep. 22, 2009

(54) METALLIZATION LAYER OF A SEMICONDUCTOR DEVICE HAVING DIFFERENTLY THICK METAL LINES AND A METHOD OF FORMING THE SAME

(75) Inventors: Matthias Lehr, Dresden (DE); Matthias Schaller, Boxdorf (DE); Carsten Peters, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 155 days.

(21) Appl. No.: 11/619,235

(22) Filed: Jan. 3, 2007

(65) Prior Publication Data

US 2007/0278693 A1 Dec. 6, 2007

(30) Foreign Application Priority Data

May 31, 2006 (DE) ........................ 10 2006 025 405

(51) Int. Cl.
*H01L 21/4763* (2006.01)
(52) U.S. Cl. ........................ 438/687; 438/633; 438/656; 438/672; 438/676; 257/E21.577; 257/E21.579; 257/E21.582; 257/E21.585; 257/E21.586
(58) Field of Classification Search ................. 438/618, 438/620, 622, 626, 627, 629, 633–687, 702, 438/740, 758, 761, 763, 778, 780, 931, 952; 257/E21.169, 483, 579, 584, 585, 591, E23.019, 257/161, E21.577–E21.585
See application file for complete search history.

(56) References Cited

U.S. PATENT DOCUMENTS

| | | | | |
|---|---|---|---|---|
| 5,173,442 A | * | 12/1992 | Carey | 216/18 |
| 5,821,169 A | * | 10/1998 | Nguyen et al. | 438/736 |
| 5,840,625 A | * | 11/1998 | Feldner | 438/626 |
| 5,985,753 A | | 11/1999 | Yu et al. | 438/866 |
| 6,001,414 A | * | 12/1999 | Huang et al. | 438/622 |
| 6,103,619 A | * | 8/2000 | Lai | 438/638 |
| 6,114,243 A | * | 9/2000 | Gupta et al. | 438/671 |
| 6,127,258 A | * | 10/2000 | Watanabe et al. | 438/625 |
| 6,177,347 B1 | * | 1/2001 | Liu et al. | 438/675 |
| 6,274,484 B1 | * | 8/2001 | Tsai et al. | 438/648 |
| 6,307,267 B1 | * | 10/2001 | Wada et al. | 257/761 |
| 6,316,359 B1 | * | 11/2001 | Simpson | 438/678 |

(Continued)

FOREIGN PATENT DOCUMENTS

KR 1020050054066 A 10/2005

(Continued)

*Primary Examiner*—Michael S Lebentritt
(74) *Attorney, Agent, or Firm*—Williams, Morgan & Amerson, P.C.

(57) ABSTRACT

A semiconductor device comprises metal lines in a specific metallization layer which have a different thickness and thus a different resistivity in different device regions. In this way, in high density areas of the device, metal lines of reduced thickness may be provided in order to comply with process requirements for achieving a minimum pitch between neighboring metal lines, while in other areas having less critical constraints with respect to minimum pitch, a reduced resistivity may be obtained at reduced lateral dimensions compared to conventional strategies. For this purpose, the dielectric material of the metallization layer may be appropriately patterned prior to forming respective trenches or the etch behavior of the dielectric material may be selectively adjusted in order to obtain differently deep trenches.

16 Claims, 9 Drawing Sheets

U.S. PATENT DOCUMENTS

| | | | |
|---|---|---|---|
| 6,319,819 B1* | 11/2001 | Besser et al. | 438/633 |
| 6,319,834 B1* | 11/2001 | Erb et al. | 438/687 |
| 6,372,665 B1* | 4/2002 | Watanabe et al. | 438/780 |
| 6,380,625 B2* | 4/2002 | Pramanick et al. | 257/751 |
| 6,436,808 B1* | 8/2002 | Ngo et al. | 438/623 |
| 6,562,712 B2* | 5/2003 | Liu et al. | 438/631 |
| 6,573,148 B1* | 6/2003 | Bothra | 438/381 |
| 6,576,525 B2* | 6/2003 | Stamper | 438/386 |
| 6,593,654 B2* | 7/2003 | Oyamatsu | 257/758 |
| 6,815,820 B2 | 11/2004 | Yu et al. | 257/758 |
| 6,849,923 B2* | 2/2005 | Seta et al. | 257/635 |
| 6,879,042 B2* | 4/2005 | Ohto et al. | 257/751 |
| 6,903,001 B2* | 6/2005 | Bhattacharyya et al. | 438/622 |
| 6,951,826 B2* | 10/2005 | Bencher et al. | 438/761 |
| 6,989,105 B2* | 1/2006 | Gambino et al. | 216/67 |
| 7,068,138 B2* | 6/2006 | Edelstein et al. | 336/200 |
| 7,186,644 B2* | 3/2007 | Lee | 438/637 |
| 7,242,096 B2* | 7/2007 | Kanamura | 257/759 |
| 7,268,434 B2* | 9/2007 | Nakashima | 257/774 |
| 7,282,441 B2* | 10/2007 | Fuller et al. | 438/637 |
| 7,309,654 B2* | 12/2007 | Schaller et al. | 438/700 |
| 7,375,024 B2* | 5/2008 | Park | 438/627 |
| 7,452,822 B2* | 11/2008 | Shih et al. | 438/704 |
| 2005/0130402 A1* | 6/2005 | Ramachandramurthy Pradeep et al. | 438/618 |

FOREIGN PATENT DOCUMENTS

WO    WO 2008/007259 A2 *    1/2008

* cited by examiner

METALLIZATION LAYER OF A SEMICONDUCTOR DEVICE HAVING DIFFERENTLY THICK METAL LINES AND A METHOD OF FORMING THE SAME

BACKGROUND OF THE INVENTION

1. Field of the Invention

Generally, the present disclosure relates to the formation of integrated circuits, and, more particularly, to the formation of metallization layers including highly conductive metals, such as copper, embedded into a dielectric material.

2. Description of the Related Art

In an integrated circuit, a very large number of circuit elements, such as transistors, capacitors, resistors and the like, are formed in or on an appropriate substrate, usually in a substantially planar configuration. Due to the large number of circuit elements and the required complex layout of advanced integrated circuits, the electrical connections of the individual circuit elements are generally not established within the same level on which the circuit elements are manufactured. Typically, such electrical connections are formed in one or more additional "wiring" layers, also referred to as metallization layers. These metallization layers generally include metal-containing lines, providing the intra-level electrical connection, and also include a plurality of inter-level connections, also referred to as vias, providing electrical connection between two neighboring stacked metallization layers, wherein the metal-containing lines and vias may also be commonly referred to as interconnect structures.

Due to the continuous shrinkage of the feature sizes of circuit elements in modern integrated circuits, the number of circuit elements for a given chip area, that is the packing density, also increases, thereby requiring an even larger increase in the number of electrical interconnections to provide the desired circuit functionality. Therefore, the number of stacked metallization layers may increase and the dimensions of the individual metal lines and vias may be reduced as the number of circuit elements per chip area becomes larger. The fabrication of a plurality of metallization layers entails extremely challenging issues to be solved, such as mechanical, thermal and electrical reliability of each metallization layer in the layer stack. As the complexity of integrated circuits advances and brings about the necessity for conductive lines that can withstand moderately high current densities, semiconductor manufacturers are increasingly replacing the well-known metallization metal aluminum with a metal that allows higher current densities and hence allows a reduction in the dimensions of the interconnections and thus the number of stacked metallization layers. For example, copper and alloys thereof are materials that are used to increasingly replace aluminum due to their superior characteristics in view of higher resistance against electromigration and significantly lower electrical resistivity when compared with aluminum. Despite these advantages, copper and copper alloys also exhibit a number of disadvantages regarding the processing and handling in a semiconductor facility. For instance, copper may not be efficiently applied onto a substrate in larger amounts by well-established deposition methods, such as chemical vapor deposition (CVD), and also may not be effectively patterned by the usually employed anisotropic etch procedures. Consequently, in manufacturing metallization layers including copper, the so-called inlaid or damascene technique (single and dual) is therefore preferably used wherein a dielectric layer is formed first and then patterned to receive trenches and/or vias, which are subsequently filled with copper or copper alloys.

Another problem in manufacturing a metallization layer is the fact that controversial properties of a single metallization layer within a die region may have to be met with respect to conductivity and minimum pitch between neighboring metal lines. For example, in one region, a high density of metal lines may be present due to a high density of semiconductor devices requiring a large number of electrical connections, while in other die regions, with less critical constraints with respect to a minimum pitch, the resistivity of the metal lines may have to be reduced, thereby requiring, in conventional techniques, increased line widths, which may result in a significantly increased die area occupied by these low-resistivity lines despite the relaxed constraints in view of the line density.

With reference to FIGS. 1a-1b, a typical semiconductor device including a metallization layer will now be described in more detail in order to illustrate conventional approaches and process techniques for forming metal lines in high density areas and low density areas.

FIG. 1a schematically illustrates a semiconductor device 100 comprising a substrate 101, for instance a substrate-on-silicon basis as is frequently used for the formation of integrated circuits and the like. A device layer 102 may be formed above the substrate 101, which may include a plurality of semiconductor devices, such as transistors, capacitors, resistors and the like, depending on the specific circuit layout of a corresponding electronic circuit. For convenience, any such circuit elements are not shown in FIG. 1a. The device layer 102 may define, for instance due to a difference in packing density of circuit elements and the like, a first device region 110A and a second device region 110B, in which is formed a metallization layer 120 which may comprise respective metal lines 121A and 121B, which may be connected to respective conductive regions 130A, 130B by means of corresponding vias 122A, 122B, wherein the regions 130A, 130B may be formed in a dielectric layer 125. Thus, the metal lines 121A, 121B may provide an intra-level electrical connection within the metallization layer 120, while the vias 122A, 122B provide the electrical connection to lower-lying circuit elements and thus finally to the semiconductor devices located in the device layer 102. It should be appreciated that the conductive regions 130A, 130B may represent respective metal lines or metal regions of a lower-lying metallization layer or may represent contact areas of circuit elements. Furthermore, the metallization layer 120 may comprise a dielectric layer 123 formed of any appropriate dielectric material, such as silicon dioxide, silicon oxynitride, silicon nitride, or, in highly advanced applications, the dielectric layer 123 may comprise a low-k dielectric material. It should be appreciated that the term "low-k dielectric material" is to be understood as an insulating material having a relative permittivity of 3.0 or less. Furthermore, an etch stop layer 124 may be provided above the conductive regions 130A, 130B and on top of a corresponding dielectric layer 125, in which the conductive regions 130A, 130B are embedded. It should be appreciated that the metal lines 121A and 121B, which, in sophisticated applications, may comprise copper, may have the same design dimensions, which may be substantially determined by process tolerances of the metal lines 121B formed in the second device region 110B requiring a high line density, for instance due to a required number of electrical connections. In other illustrative embodiments, if the lines 121A in the first device region 110A upon which less critical constraints with respect to a minimum pitch between neighboring metal lines 121A are imposed, the respective line width 121W may be selected greater compared to the lines 121B in order to provide reduced resistivity in the device region 110A, thereby increasing the performance of the metal line 121A in the region 110A. However, a corresponding increase in performance may be obtained at the cost of a significantly increased substrate area, thereby reducing the overall packing density of the semiconductor device 100.

A typical process flow for forming the semiconductor device 100 as shown in FIG. 1a may comprise the following processes. After the formation of any circuit elements in the device layer 102 on the basis of well-established techniques, one or more metallization layers may be formed, wherein the dielectric layer 125 in combination with the conductive regions 130A, 130B may represent one of these metallization layers. In other cases, when the regions 130A, 130B represent conductive areas of circuit elements, appropriate contact technologies may be used. The dielectric layer 125 may be formed on the basis of well-established deposition techniques, such as chemical vapor deposition (CVD) and the like, wherein the conductive regions 130A, 130B may be formed prior to or after the formation of the dielectric layer 125, depending on the specific device level considered. Thereafter, the etch stop layer 124 may be deposited, for instance by plasma enhanced chemical vapor deposition (PECVD) on the basis of well-established techniques, wherein silicon nitride, silicon carbide, nitrogen-enriched silicon carbide and the like, or any combinations thereof, may be used.

Next, in sophisticated techniques, the dielectric layer 123 may be formed by any appropriate process technique, including CVD, spin-on techniques and the like, to provide a desired material composition, such as a low-k dielectric material. Thereafter, depending on process strategies, the vias 122A, 122B may be formed in the dielectric layer 123, for instance by first depositing a portion of the layer 123 and patterning the portion so as to receive respective openings, which may be subsequently filled with an appropriate material, such as a copper-based material including a barrier material, if required. Thereafter, a second portion of the dielectric layer 123 may be deposited and patterned so as to receive respective trenches for forming therein the metal lines 121A, 121B. In other process techniques, the dielectric layer 123 may be deposited with its final thickness and may be patterned to receive trenches first and respective openings for the vias 122A, 122B last, or, in other alternatives, openings for the vias 122A, 122B may be formed first and thereafter trenches for the lines 121A, 121B may be formed subsequently. During the formation of the respective trenches, a respective anisotropic etch process is performed on the basis of well-established recipes, wherein the corresponding etch step is stopped at a desired height within the dielectric layer 123, which is substantially identical for the trenches in the first and second device regions 110A, 110B, except for minor non-uniformities that may be caused by a difference in pattern density and the like.

Thereafter, depending on the process strategy, a barrier material may be formed within the respective trenches, possibly in combination with an appropriate seed layer, and thereafter the metal, such as copper, may be filled in by well-established electrochemical deposition techniques. Any excess material may be removed, for instance by electrochemical polishing, CMP and the like, thereby also planarizing the resulting topography of the metallization layer 120. Due to the patterning process for forming the respective trenches in the first and second device regions 110A, 110B in combination with a common process for filling the trenches, respective process constraints may dictate certain device features, such as a thickness 121T of the metal lines 121B and thus a corresponding thickness of the metal lines 121A, since, due to possible constraints with respect to a high line density in the second device region 110B, the depth of respective trenches and thus the finally obtained thickness 121T may have to be selected so as to provide sufficient process margins for avoiding any short circuits between neighboring metal lines 121B.

FIG. 1b schematically illustrates the device 100 according to another conventional configuration, in which the metallization layer 120 may comprise the dielectric layer 123 in the form of a hybrid structure including an upper portion 123U and a lower portion 123L, which may be comprised of different materials so as to obtain a desired behavior of the dielectric layer 123 in terms of reduced permittivity while nevertheless providing a moderately high mechanical stability. For instance, the upper portion 123U may be comprised of a low-k dielectric material, while the lower portion 123L may be formed of a material having increased mechanical stability compared to the upper portion 123U, such as, for instance, silicon dioxide, fluorine-doped silicon dioxide and the like. However, with respect to the characteristics of the metal lines 121A, 121B, the same criteria apply as previously explained with reference to FIG. 1a. Consequently, when metal lines of different packing density are required in different device regions within a single die area, the conventional technique for the formation of metallization layers may not efficiently allow a combination of low-resistivity metal lines in one region while providing closely spaced metal regions in another die region.

The present disclosure is directed to various methods and systems that may solve, or at least reduce, some or all of the aforementioned problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a technique that provides enhanced flexibility during the formation of conductive lines, such as metal lines, in that the resistivity of metal lines is to a certain degree decoupled from the lateral dimensions thereof without unduly contributing to process complexity and maintaining a high degree of compatibility with conventional process strategies. For this purpose, metal lines may be formed in different device regions having a different thickness, thereby providing the potential for efficiently adjusting the corresponding line resistivity on the basis of the respective thickness of the metal, while substantially avoiding or reducing an increase of lateral dimensions in areas requiring low resistivity metal lines. Consequently, for a given design of a metallization layer, the conductivity of metal lines in selected device regions may be increased for given design dimensions when the constraints with respect to the pitch to neighboring metal lines is less demanding, thereby increasing performance without consuming additional substrate area. On the other hand, in respective designs of metallization layers requiring low resistivity lines, which may be conventionally obtained by increasing the lateral dimensions of the metal lines, a corresponding reduction of lateral dimension for the same line resistance may save substrate area, thereby reducing the dimensions of the respective circuit or provide the potential for increasing circuit complexity without consuming additional substrate area.

According to one illustrative embodiment disclosed herein, a method comprises forming a first conductive line having a first target thickness in a first portion of a dielectric layer that is located in a first device region of a semiconductor device. Furthermore, a second conductive line having a second target thickness other than the first target thickness is formed in a second portion of the dielectric layer and is located in a second device region. Forming the first and second conductive lines comprises depositing a conductive material for the first and second conductive lines in a common deposition process.

According to another illustrative embodiment, a method comprises forming a first conductive line having a first target thickness in a first portion of a dielectric layer that is located in a first device region of a semiconductor device. Furthermore, a second conductive line having a second target thickness other than the first target thickness is formed in a second portion of the dielectric layer and is located in a second device region. Forming the first and second conductive lines comprises forming a first trench in the first device region and a second trench in the second device region in a common etch process.

According to yet another illustrative embodiment, a semiconductor device comprises a device layer formed in a first device region and a second device region, which comprises circuit elements in the first and second device regions. The semiconductor device further comprises a metallization layer formed above the device layer in the first device region and the second device region. Furthermore, a first metal line having a first thickness is formed in the metallization layer in the first device region, wherein the first metal line is electrically connected to a circuit element in the device layer. Finally, a second metal line having a second thickness is formed in the metallization layer in the second device region and is electrically connected to a circuit element in the device layer, wherein the first thickness is greater than the second thickness.

BRIEF DESCRIPTION OF THE DRAWINGS

The invention may be understood by reference to the following description taken in conjunction with the accompanying drawings, in which like reference numerals identify like elements, and in which.

Figure 1A:
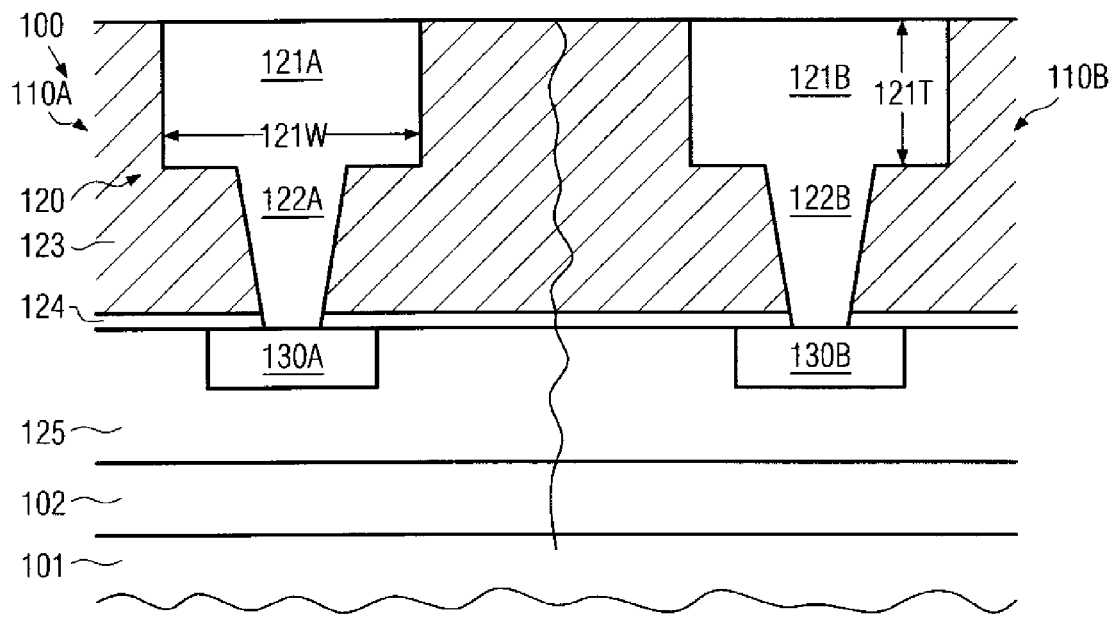
FIGS. 1a-1b schematically illustrate a cross-sectional view of a conventional semiconductor device including a metallization layer having metal lines with a substantially uniform thickness in low density device areas and high density device areas.
Figure 1B:
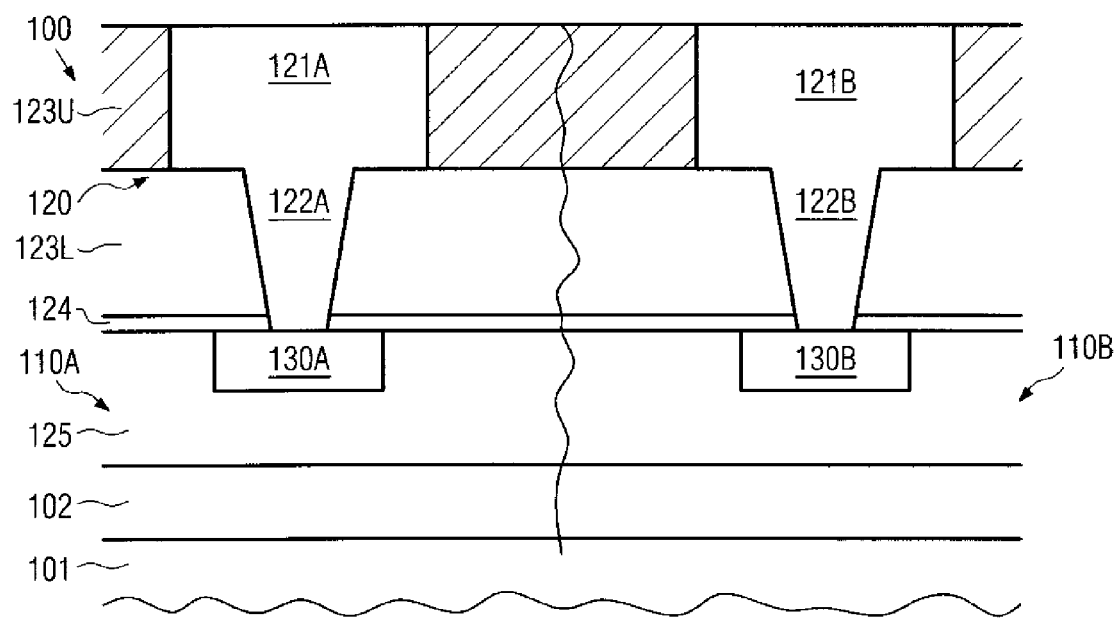

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure is related to a technique for the formation of conductive lines, which, in some illustrative embodiments, may represent metal lines with different design or target thickness in order to enhance flexibility in configuring the metallization layers of semiconductor devices. Consequently, in a single metallization layer, different types of conductive lines, such as metal lines, may be provided, which may have lateral dimensions so as to comply with desired design criteria with respect to the minimum pitch in the various device regions. Hence, conductive lines of reduced thickness may, for instance, be formed in device areas requiring a high packing density of the conductive lines, so that the corresponding process techniques may require a moderately thin conductive material layer, due to limitations in deposition and etch techniques for patterning and forming the respective conductive lines. On the other hand, in other device regions, a respective thickness or depth of the conductive lines may be selected on the basis of the respective process capabilities so as to obtain a maximum thickness and thus a reduced line resistivity while nevertheless enabling a reliable process sequence. Since, in this case, a desired low resistance of the conductive lines may be obtained on the basis of a reduced lateral dimension compared to conventional techniques, a significant gain in performance may be accomplished while the required process robustness may still be maintained. It should be appreciated that the present invention is highly advantageous in the context of sophisticated semiconductor devices requiring metallization layers on the basis of copper and low-k dielectric materials, wherein a corresponding reduction of substrate area may provide further potential for forming an increased number of high end circuits on the same substrate, or wherein further functions may be incorporated into a given die area. It should be appreciated, however, that the present invention is also highly advantageous in combination with other conductive materials, such as aluminum and the like. Moreover, since more and more functions may typically be incorporated into a single semiconductor device, which may require device areas operating on increased power levels, whereas other device areas require high packing density for complex logic circuitry, an increased flexibility in forming respective metallization layers may be provided by the present invention, since a further degree of freedom is provided for adjusting a desired line resistivity substantially without contributing to process complexity. Thus, in some illustrative embodiments, one or more critical steps in the formation of the respective conductive lines of different thickness may be performed as common processes, thereby providing a high degree of compatibility with conventional techniques. For example, the process of the metal deposition and/or the process of forming respective trenches for receiving the metal lines according to damascene or inlaid strategies may be performed as common processes in order to provide process compatibility and reduced complexity, while providing significantly enhanced design flexibility.

With reference to the accompanying drawings, further illustrative embodiments of the present disclosure will now be described in more detail. It should be appreciated that any positional information, such as "lateral," "above," "below," "substantially planar," "height," "depth" and the like, are to be understood as being referred to a respective substrate. That is, a first layer is formed "above" a second layer, when the second layer is located closer to the substrate. Moreover, a lateral direction is a direction substantially parallel to the surface of the substrate, wherein respective terms, such as height, depth, thickness and the like, refer to directions substantially perpendicular to the surface of the substrate. Furthermore, in the following illustrative embodiments, it may be referred to metal lines, which may be considered as conductive lines comprising a metal. In this case, well-established metallization materials, such as copper, aluminum, silver, platinum, gold, refractory metals and the like, as well as any combinations thereof, and combinations of these metals with other non-metal materials, may be used. The present disclosure may, however, also apply to any conductive materials when suitable for forming metallization structures.

Figure 2A:
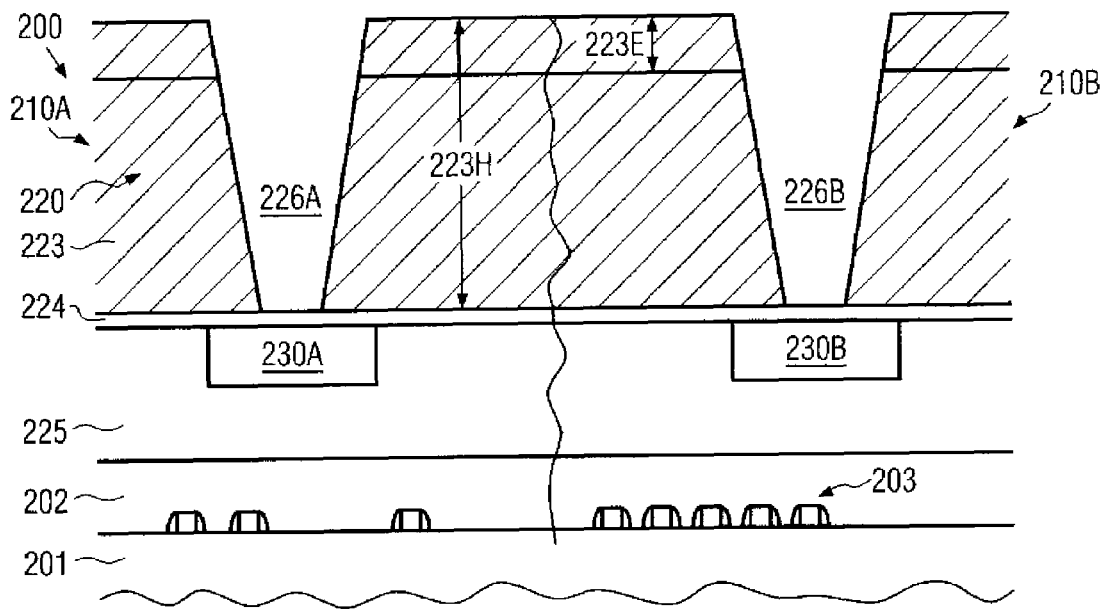
FIGS. 2a-2g schematically illustrate cross-sectional views of a semiconductor device during various manufacturing stages in forming metal lines in different device regions with different thicknesses.

FIG. 2a schematically illustrates a cross-sectional view of a semiconductor device 200 comprising a substrate 201, which may represent any appropriate substrate for the formation of integrated circuits, micro-mechanical devices, electro-optical devices and the like, in which a metallization layer is required. Thus, the substrate 201 may represent a semiconductor substrate, such as a silicon bulk substrate, a silicon-on-insulator (SOI) substrate, or any other appropriate carrier material having formed thereon a layer of semiconductor material that enables the formation of a device layer 202 including a plurality of circuit elements 203. It should be appreciated that the device layer 202 formed above the substrate 201 may have any appropriate configuration in order to allow the formation of respective circuit elements therein, wherein the circuit elements 203 may be provided in a substantially planar configuration, in a stacked configuration, when different levels of devices are required, and the like. In one illustrative embodiment, the packing density of the circuit elements 203 located in a first device region 210A may differ from a corresponding packing density in a second device region 210B. Typically, in electronic circuitries, an increased number of circuit elements per unit area may also require an increased number of electrical connections therebetween, thereby typically requiring a densely packed wiring structure in a corresponding portion of the one or more metallization layers. In other cases, the first and second device regions 210A, 210B may differ in the type of circuitry used, such as power circuitry compared to control logic circuitry, memory areas relative CPU cores, analog areas versus digital areas, and the like, thereby also requiring different characteristics for the metal lines in the corresponding one or more metallization layers formed above the device layer 202.

The semiconductor device 200 may further comprise a dielectric layer 225 formed above the device layer 202, which may represent any appropriate interlayer dielectric material for embedding respective conductive regions 230A, 230B, which may represent metal lines of a metallization layer, contact areas of specific circuit elements and the like. Thus, the dielectric layer 225 may be comprised of any appropriate material, such as silicon dioxide, silicon nitride, low-k dielectric materials and the like. Similarly, the conductive regions 230A, 230B may be comprised of metal or metal compounds, highly doped semiconductor materials and the like. Furthermore, in this manufacturing stage, an etch stop layer 224 may be formed above the conductive regions 230A, 230B and the dielectric layer 225, which may be comprised of any appropriate material, such as silicon nitride, silicon carbide, nitrogen-enriched silicon carbide, a combination of any of these materials, and the like. Formed above the dielectric layer 225 is a metallization layer 220 comprising, in this manufacturing stage, a dielectric layer 223 formed of any appropriate material, such as silicon dioxide, silicon nitride, a low-k dielectric material, or any combination thereof, and the like. In one illustrative embodiment, the dielectric layer 223 may be comprised of a low-k dielectric material having a permittivity of 3.0 or significantly less, such as approximately 2.8 or less, wherein, in some portions of the dielectric layer 223, a material (not shown) of increased permittivity and thus increased mechanical stability may be incorporated. For instance, intermittently or in an upper portion of the layer 223, a dielectric material of increased density and thus stability may be provided. Thus, the low-k dielectric material in the context of the layer 223 is to be understood that most of the material of layer 223 may be comprised of a low-k dielectric, while minor portions thereof may nevertheless contain material having a dielectric constant higher than 3.0. Furthermore, in the illustrative embodiment shown in FIG. 2a, in this manufacturing stage, via openings 226A, 226B may be formed in the dielectric layer 220 in the first and second device regions 210A, 210B, respectively, wherein respective trenches for metal lines in the first and second device regions 210A, 210B above the respective via openings 226A, 226B are still to be formed. Hence, the corresponding manufacturing sequence may be referred to as a dual inlaid technique, in which vias are formed first and trenches are formed last. In other illustrative embodiments, a different approach may be used, typically referred to as a dual inlaid technique with trenches being formed first followed by the corresponding vias. In still other illustrative embodiments, the metallization layer 220 may be formed by first forming a via layer, i.e., a dielectric layer having formed therein respective vias connecting to the conductive regions 230A, 230B, followed by the formation of a respective metal line layer, which may be formed on the basis of the principles as described above or as described later on. Consequently, the present invention should not be construed as being restricted to a specific process sequence in forming respective vias and metal lines unless such restrictions are explicitly set forth in the specification or the appended claims.

A typical process flow for forming the semiconductor device 200 as shown in FIG. 2a may comprise the following processes. After the formation of the device layer 202 above the substrate 201 on the basis of well-established process techniques, the dielectric layer 225 and the conductive regions 230A, 230B may be formed in conformity with appropriate well-known techniques. Thereafter, the etch stop layer 224 may be deposited on the basis of CVD techniques and thereafter the dielectric layer 223 may be formed on the basis of the selected approach as discussed above. In the illustrative embodiment shown in FIG. 2a, the dielectric layer 223 may be deposited on the basis of any appropriate technique, wherein a thickness or height of the dielectric layer 223, indicated as 223H, may be selected so as to provide a specified excess height indicated as 223E, which may substantially correspond to a desired difference in thickness of respective metal lines still to be formed in the metallization layer 220. For example, in sophisticated semiconductor devices based on copper and low-k dielectric materials, the excess height 223E may range from approximately 10-80 nm. It should be appreciated, however, that any other excess height 223E may be used, if appropriate for the device design under consideration. After the deposition of the layer 220, in some illustrative embodiments, a corresponding patterning process may be performed, for instance on the basis of photolithography, in order to provide an appropriate resist mask (not shown) for etching through the dielectric layer 223 on the basis of the respective resist mask. In other embodiments, the patterning of the dielectric layer 223 may be performed on the basis of nano-imprint techniques, wherein the layer 223, for instance provided in a low viscous state, may be patterned on the basis of a respective nano-stamp that may be removed after curing the layer 223. After forming the via openings 226A, 226B, the corresponding resist mask, if required, may be removed on the basis of well-established techniques.

Figure 2B:
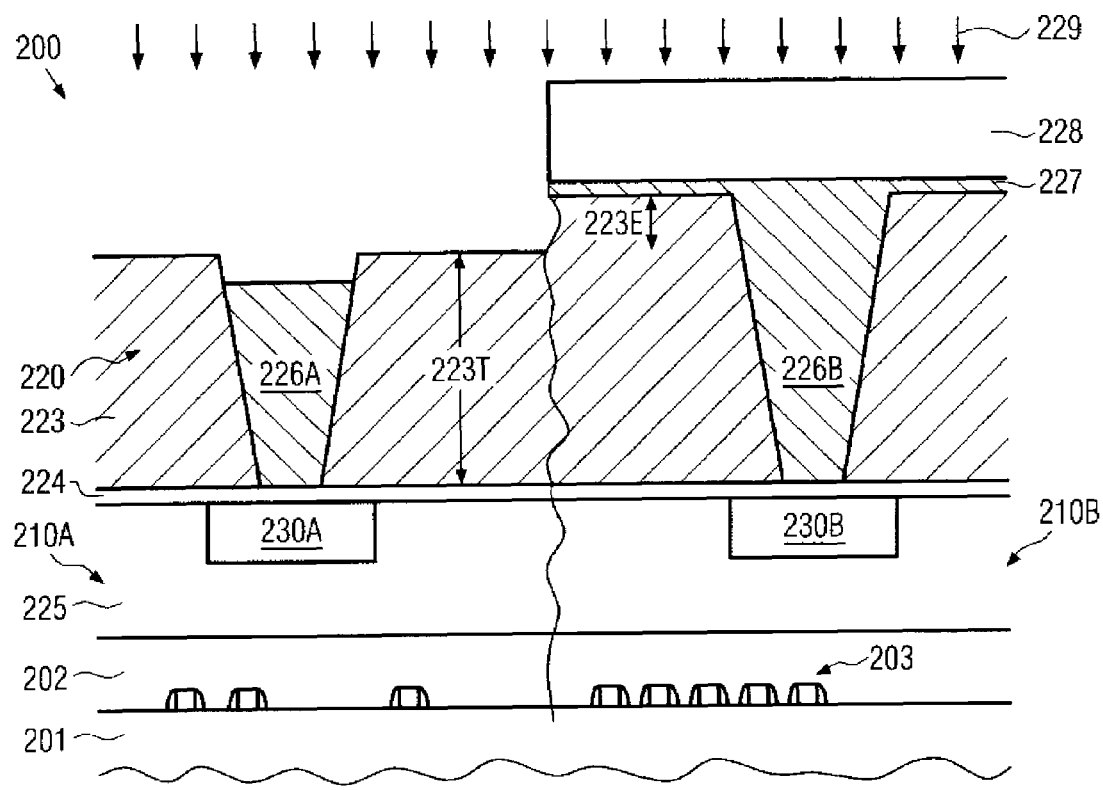

FIG. 2b schematically illustrates the semiconductor device 200 in a further advanced manufacturing stage. The device 200 may comprise an etch mask 228, such as a resist mask, which may be formed above a fill material 227, which can be comprised of photoresist of the same type or different type compared to the mask 228, when provided in the form of a resist mask. In other cases, an appropriate polymer material may be used for the fill material 227, which may be deposited in a highly non-conformal manner. For example, the fill material 227 may be applied by spin-on techniques, wherein, depending on the requirements for a subsequent lithography for patterning the mask 228, the material 227 may have appropriate characteristics with respect to optical behavior and the like. In still other cases, a resist material may be deposited, which may also be used as a base material for the mask 228, when at least a portion of the respective material may remain unexposed in the via opening 226A after a corresponding exposure process. Thereafter, the etch mask 228 may be patterned, for instance by a development process, during which the material 227 may also be patterned, i.e., removed in the first device region 210A, or which may be removed, at least partially, in a separate process step. Based on the etch mask 228, an etch process 229 may be performed in order to selectively remove material of the dielectric layer 223 so as to obtain a target thickness 223T, which may substantially correspond to the original thickness 223H minus the excess thickness 223E. Corresponding etch recipes for etching a dielectric material are well established in the art. It should be appreciated that the degree of selectivity of the etch process 229 with respect to the resist mask 228 and the fill material 227 may not be critical as long as a reliable coverage of the second device region 210B during the etch process 229 is guaranteed. Thereafter, the etch mask 228 and, in some embodiments, the fill material 227 may be removed on the basis of well-established techniques, such as an oxygen plasma-based dry etch process.

Figure 2C:
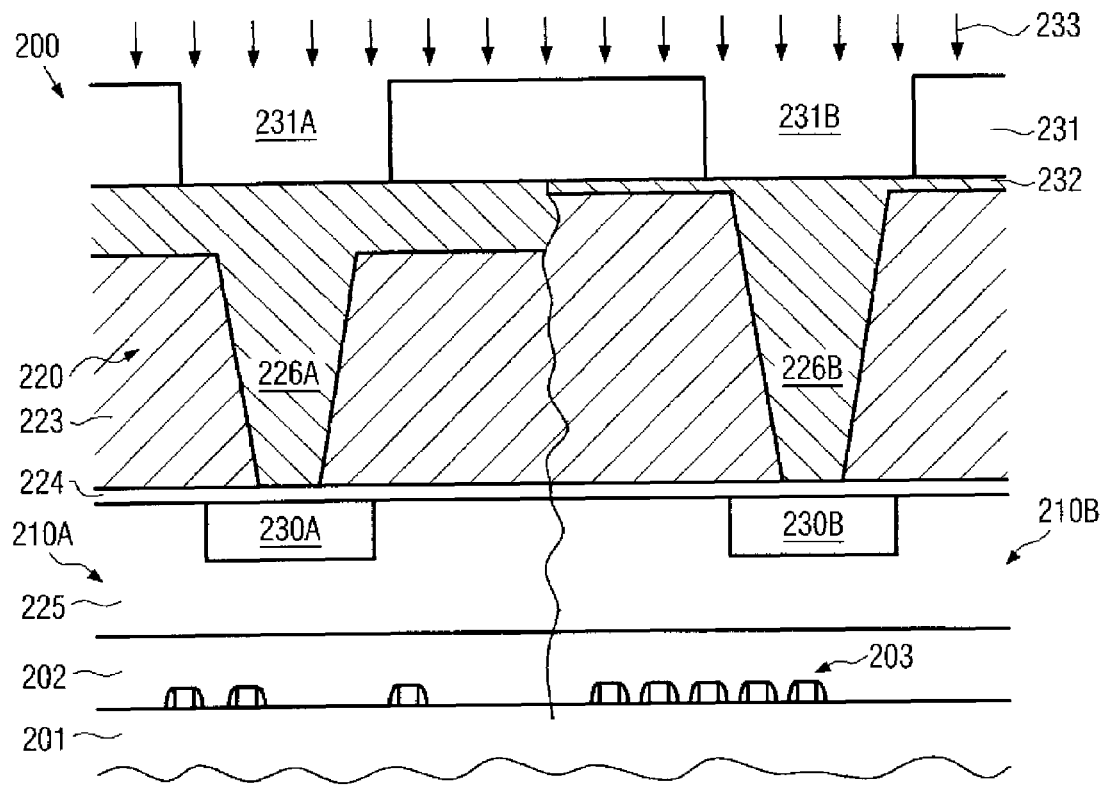

FIG. 2c schematically illustrates the device 200 in a further advanced manufacturing stage. A fill material 232 may be formed above the dielectric layer 223 so as to provide a substantially planar surface topography for a further etch mask 231, such as a resist mask that is appropriately configured to provide respective trenches in the dielectric layer 223. The same criteria also apply for the material 232, as are previously explained with respect to the fill material 227. For instance, the fill material 232 may be comprised of photoresist or any other appropriate polymer material, allowing a highly non-conformal deposition, for instance on the basis of spin-on techniques. Thereafter, the etch mask 231 may be formed on the basis of well-established photolithography techniques, wherein, in some cases, the material 232 may also act as an anti-reflective coating (ARC) during the exposure of the corresponding resist material. The etch mask 231 comprises respective trenches 231A, 231B, the lateral dimensions of which are appropriately selected with respect to design and process requirements, wherein, for a specified desired low resistivity of a metal line to be formed in the first device region 210A, reduced lateral dimensions may be used compared to conventional devices requiring the same low resistivity metal lines. On the other hand, the lateral dimensions and pitches of the respective trenches 231B in the second device region 210B may be selected in view of increased line density, wherein respective process requirements are less critical, since an upper portion of the metal line to be formed in the dielectric layer 223 will be removed, as will be described later on. Hence, process margins with respect to etching and depositing metal, for instance in view of corner rounding at upper portions of respective trenches and the like, are less critical. During the subsequent etch process 233, an etch chemistry may be used to efficiently remove the fill material 232, while a corresponding etch rate in the material of the layer 233 is significantly less. In this case, the material 232 may act as an efficient etch stop. Consequently, after removing the exposed portion of the material 232 in a subsequent etch step of the process 233, the dielectric material of the layer 223 may be etched in a common etch process down to a desired depth, wherein the excess height 223E provides a desired height offset between the respective etch fronts in the first and second device regions 210A, 210B.

Figure 2D:
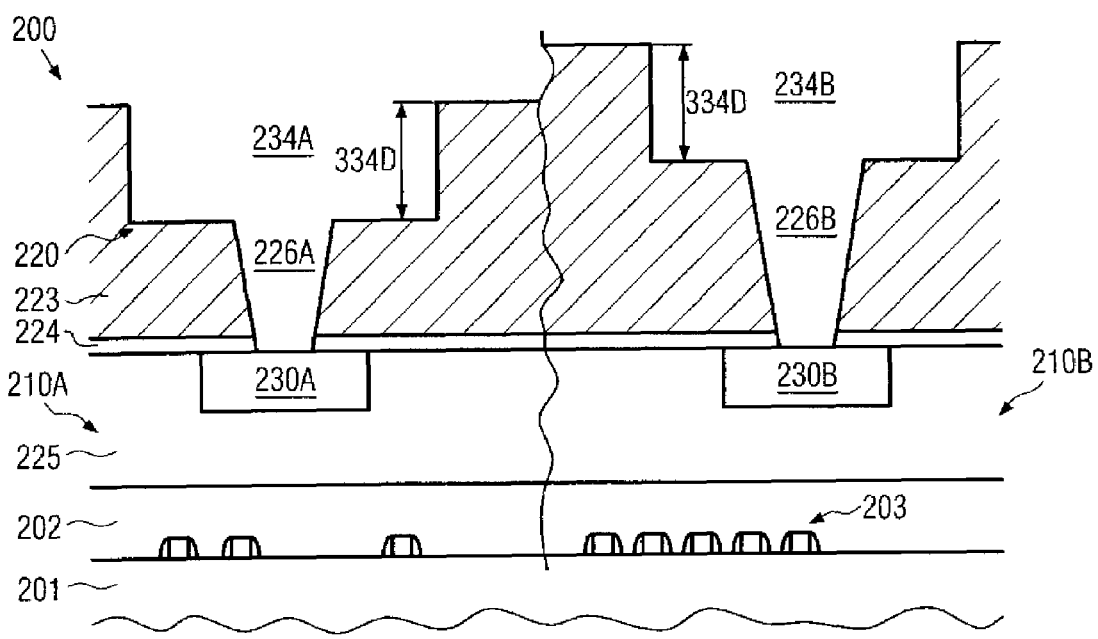

FIG. 2d schematically illustrates the semiconductor device 200 after the completion of the above-described etch process 233 and after the removal of the etch mask 231 and the fill material 232. Consequently, a trench 234A having a specified depth 234D is formed in the first region 210A, and a trench 234B, having substantially the same depth, is formed in the second device region 210B above the respective via opening 226B. Thereafter, the further processing may be continued by performing a common metal deposition process for filling the respective trenches 234A, 234B with a highly conductive metal, wherein, in the embodiment illustrated, the respective via openings 226A, 226B are also filled.

Figure 2E:
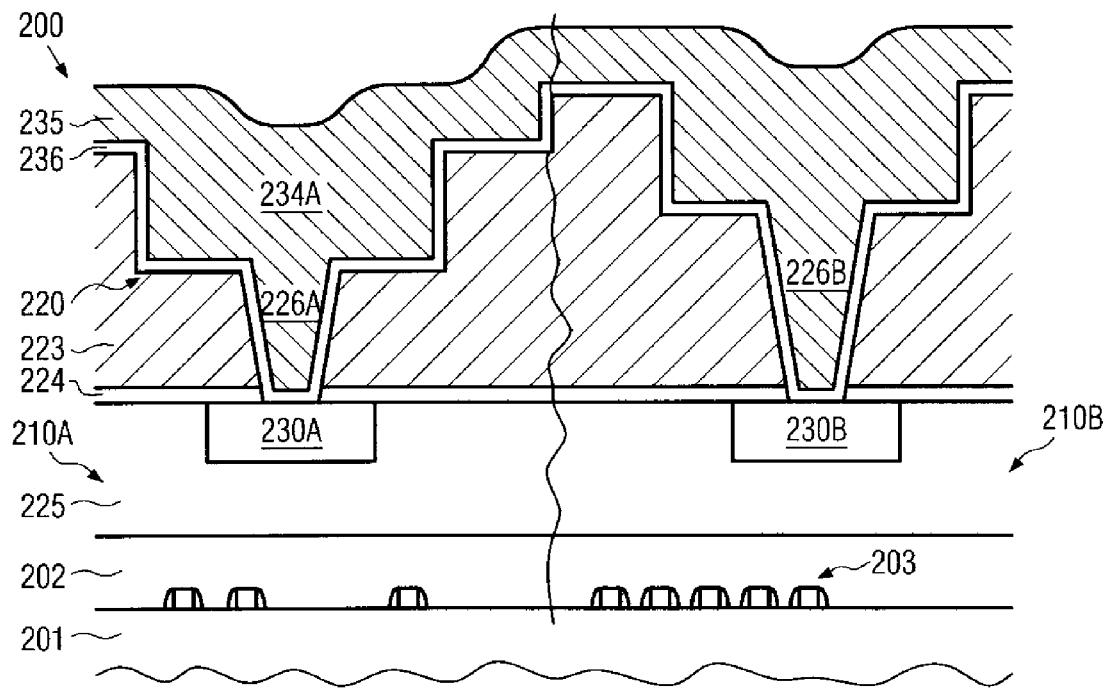

FIG. 2e schematically illustrates the semiconductor device 200 with a metal layer 235 formed above the first and second device regions 210A, 210B, wherein the metal layer 235 is provided in such a form that at least the trench 234A is completely filled. In some illustrative embodiments, the metal layer 235 may comprise copper, while, in other embodiments, other appropriate materials, such as copper alloys, aluminum, platinum, silver, combinations thereof and the like, may be used. In some illustrative embodiments, a conductive barrier layer 236 may be formed on exposed surfaces of the dielectric layer 223. For instance, a plurality of conductive materials may be used. For instance, tantalum, tantalum nitride, titanium, titanium nitride, tungsten in combination with nitrogen or silicon, tungsten/boron/phosphorous compounds, tungsten/cobalt/boron compounds and the like are materials providing a high degree of integrity of the dielectric material in the layer 223 and of the metal in the layer 235 during processing and operation of the device 200. As previously explained, some metals, such as copper, may require a reliable confinement so as to substantially suppress out-diffusion of metal atoms and to reduce any interaction of reactive components with metal atoms.

The barrier layer 236, if provided, may be formed on the basis of well-established techniques, such as sputter deposition, CVD, atomic layer deposition (ALD), electroless plating and the like. Thereafter, the metal layer 235 may be formed, for instance on the basis of wet chemical deposition techniques, such as electroplating, electroless plating, or any other deposition techniques or combinations thereof. After the formation of the metal layer 235, excess material thereof may be removed and the surface topography of the device 200 may be planarized on the basis of chemical mechanical polishing (CMP) and the like.

Figure 2F:
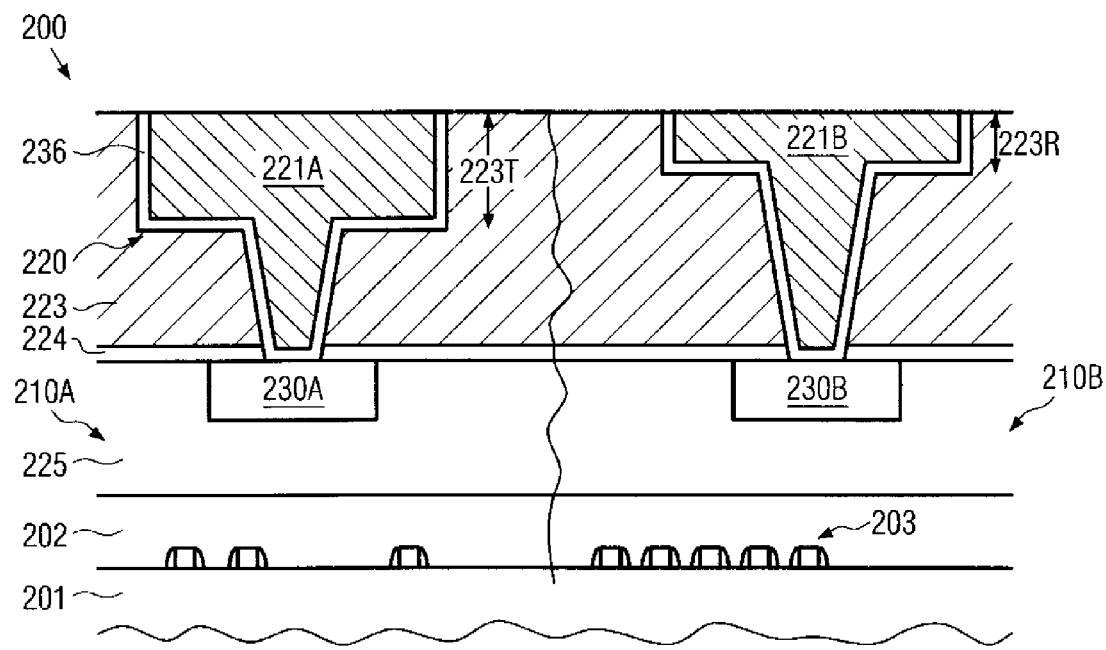

FIG. 2f schematically illustrates the semiconductor device 200 after the completion of the respective planarization process, which may be performed on the basis of appropriately selected process parameters in order to remove the excess height 223E in the second device region 210B, substantially without unduly removing material from the first device region 210A. For example, if the second device region 210B represents a region having a high density of metal lines, an increased stability may be provided so as to not unduly affect the integrity of the metallization layer 220 while removing the upper portion of the dielectric material in the second region 210B. For example, in a first CMP step, the barrier layer 236 in the second device region 210B may be exposed and may be subsequently removed in a separate CMP step, due to a typically higher hardness of the barrier layer 236 compared to the metal layer 235. Thereafter, the material removal in the second region 210B may continue in a comparable removal rate compared to the material 235 due to a reduced mechanical stability, when a low-k dielectric material is used. In this way, the barrier layer 236 in the first device region 210A may be used as a reliable indicator for controlling the CMP process. Hence, only a minor height difference between the first and second device regions 210A, 210B may remain after the corresponding planarization process. Consequently, the device 200 comprises a metal line 221A, the thickness of which substantially corresponds to the design thickness 223T, while a metal line 221B in the second device region 210B has a reduced thickness 223R, which may allow an enhanced line density in the second region 210B, since process non-uniformity during etching and depositing, such as an undue unwanted tapering of the line 221B, may be efficiently removed during the planarization process, thereby also reducing any potential short circuits between closely spaced metal lines 221B. Thus, the closely spaced metal lines 221B having a reduced thickness may be provided in the second region 210B, while an increased conductivity of the metal line 221A is obtained with a significantly reduced consumption of substrate area compared to a conventional technique, in which the same degree of conductivity would require significantly increased lateral dimensions of the metal line 221A. Moreover, a high degree of compatibility with conventional process flows may be maintained, since the patterning process of the trenches 234A, 234B as well as the formation of the metal layer 235 may be performed in a common process.

Figure 2G:
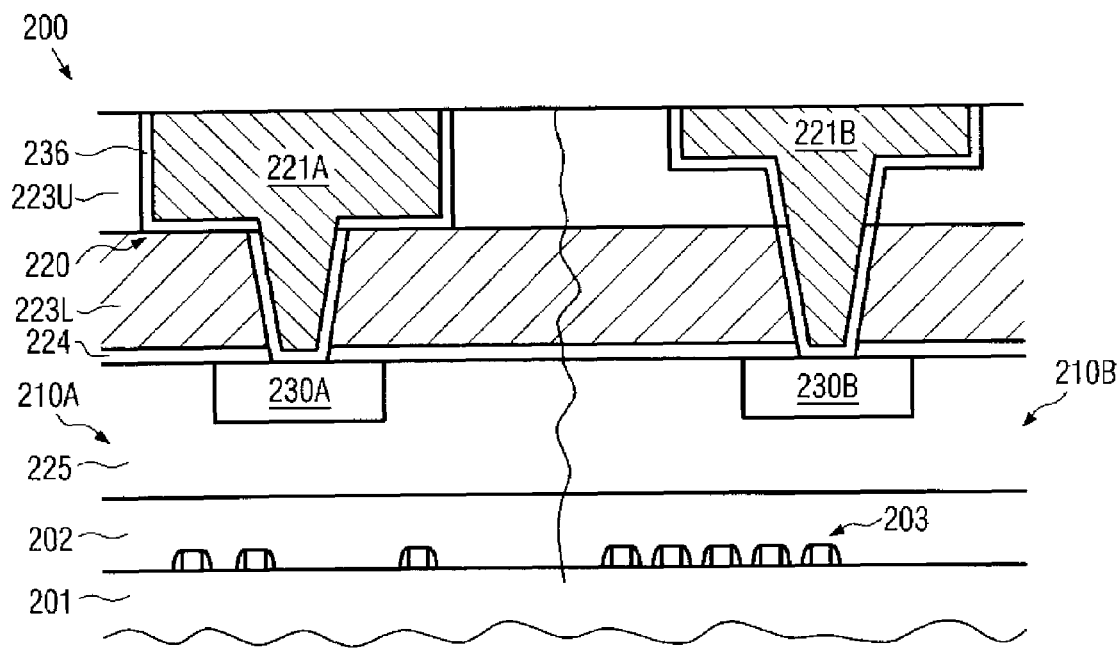

FIG. 2g schematically illustrates the semiconductor device 200 according to a further illustrative embodiment, in which the metallization layer 220 comprises the dielectric layer 223 in the form of a hybrid dielectric stack including at least an upper portion 223U and a lower portion 223L comprised of different materials. For example, the upper portion 223U may be comprised of a low-k dielectric material, such as a polymer material, a silicon-based porous material and the like. On the other hand, the lower portion 223L may be provided in the form of fluorine-doped silicon dioxide, silicon dioxide, or other low-k dielectric materials, and the like. Regarding any techniques for forming the device 200 as shown in FIG. 2g, the same criteria apply as previously explained with reference to FIGS. 2a-2f. Hence, also for a metallization layer comprising a hybrid dielectric layer stack, an efficient technique is provided for forming metal lines of different thickness with a high degree of compatibility with conventional approaches.

With reference to FIGS. 3a-3d, further illustrative embodiments of the present disclosure will now be described in more detail, in which a metallization layer with a hybrid dielectric material may also be provided.

Figure 3A:
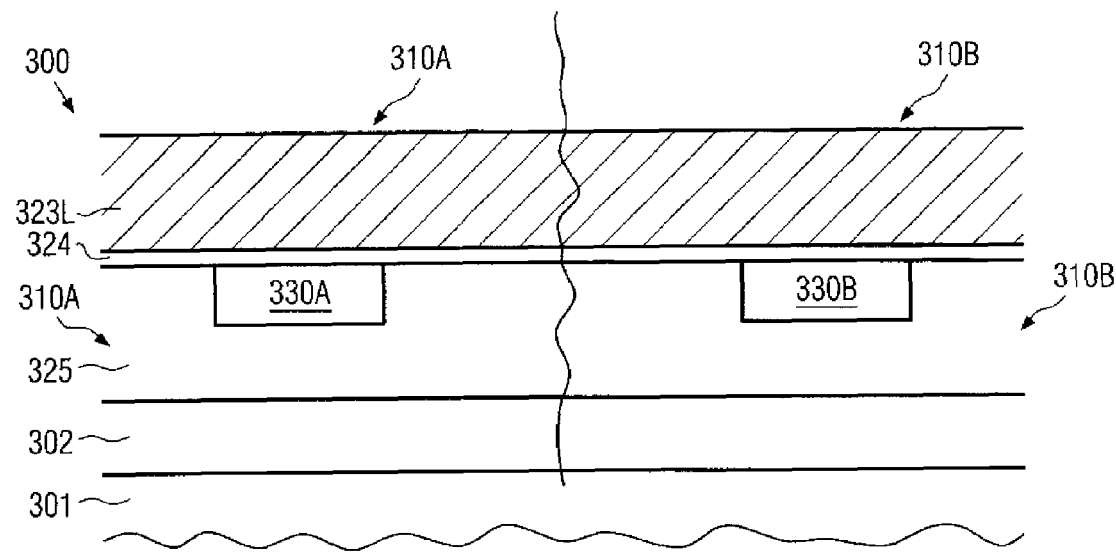
FIGS. 3a-3e schematically illustrate cross-sectional views during various manufacturing stages in forming metal lines of different thicknesses on the basis of a hybrid dielectric layer.

FIG. 3a schematically illustrates a cross-sectional view of a semiconductor device 300 comprising a substrate 301 including a device layer (not shown) and a dielectric layer 325 having formed therein respective conductive regions 330A, 330B, which are formed in respective device regions 310A, 310B. Furthermore, an etch stop layer 324 may be formed above the layer 325 and the respective conductive regions 330A, 330B. Regarding the components 301, 325, 330A, 330B and 324, the same criteria apply as previously explained in the context of the respective components of the devices 100 and 200. Moreover, respective manufacturing techniques as previously described with respect to the devices 100 and 200 may also be applied for the device 300. Furthermore, the device 300 may comprise a first dielectric sub-layer 323L, which may represent a lower portion of a hybrid dielectric layer for a corresponding metallization layer. For instance, the first sub-layer 323L may be comprised of silicon dioxide, fluorine-doped silicon dioxide or any other appropriate material. In some illustrative embodiments, the layer 323L may be comprised of a low-k dielectric material, such as a polymer material, a porous silicon-based material and the like. The layer 323L may be formed with an appropriate thickness so as to include a specified excess height for enabling a subsequent patterning of a further dielectric sub-layer to be formed above the layer 323L in a later stage. For example, the layer 323L may be formed so as to include an excess height that substantially corresponds to a desired height difference for metal lines still to be formed in the first and second device regions 310A, 310B.

Figure 3B:
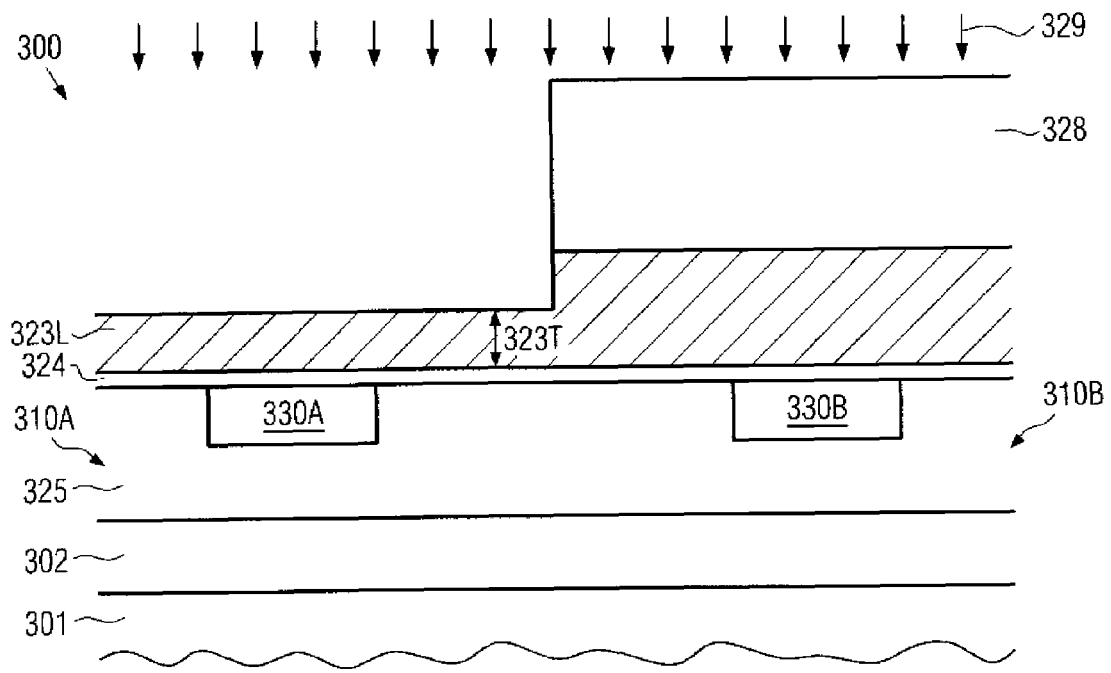

FIG. 3b schematically illustrates the semiconductor device 300 in a further advanced manufacturing stage. Here, an etch mask 328 is provided, for instance in the form of a resist mask and the like, in order to cover the second device region 310B while exposing the first device region 310A to an etch ambient 329 for removing a portion of the first sub-layer 323L. During the etch process 329, the thickness of the sub layer 323L may be reduced to a specified design or target thickness 323T. Thereafter, the etch mask 328 may be removed and a further dielectric material may be deposited.

Figure 3C:
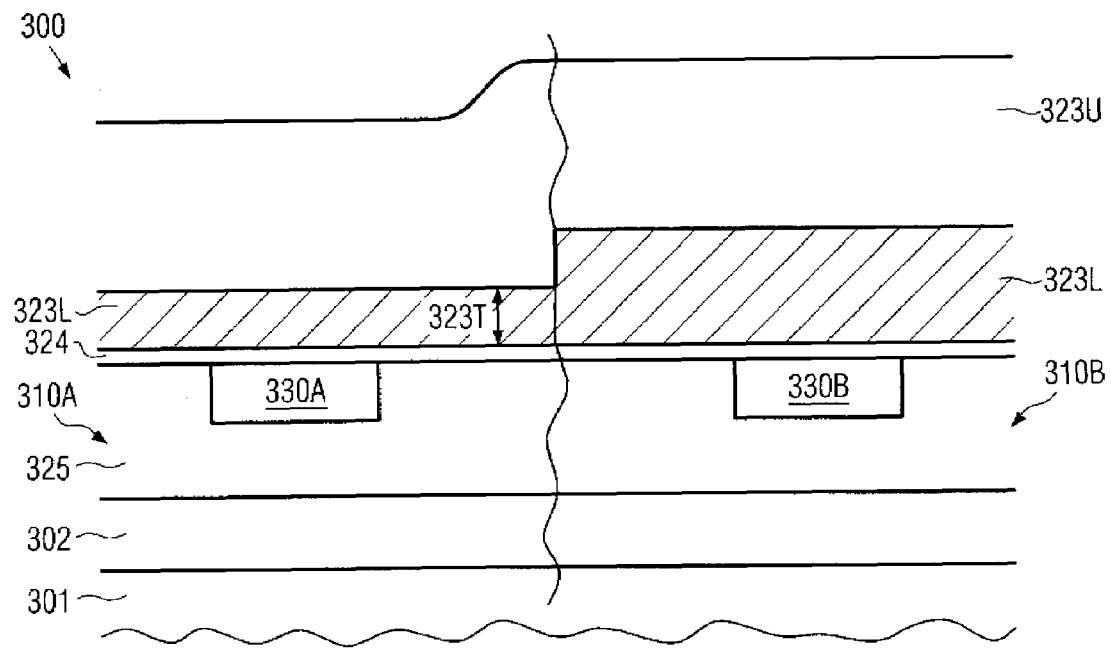

FIG. 3c schematically illustrates the semiconductor device 300 with a correspondingly deposited second sub-layer 323U formed above the patterned first sub-layer 323L. In some illustrative embodiments, the second sub-layer 323U may be comprised of a low-k dielectric material having different etch characteristics compared to the layer 323L. For instance, the second sub-layer 323U may be comprised of a low-k polymer material, while the layer 323L may be comprised of a silicon-based material, such as silicon dioxide, fluorine-doped silicon dioxide and the like. In other cases, both sub-layers 323U, 323L may be provided in the form of low-k dielectric materials having significant different etch characteristics with respect to an etch process to be performed at a later stage. In other illustrative embodiments, the first sub-layer 323L may be comprised of a material having a significantly higher etch rate compared to the layer 323U, when an increased thickness of a respective metal line is desired in the second device region 310B. After the deposition of the layer 323U, a CMP process may be performed in order to planarize the surface topography and to provide a desired target thickness for the second sub-layer 323U.

Figure 3D:
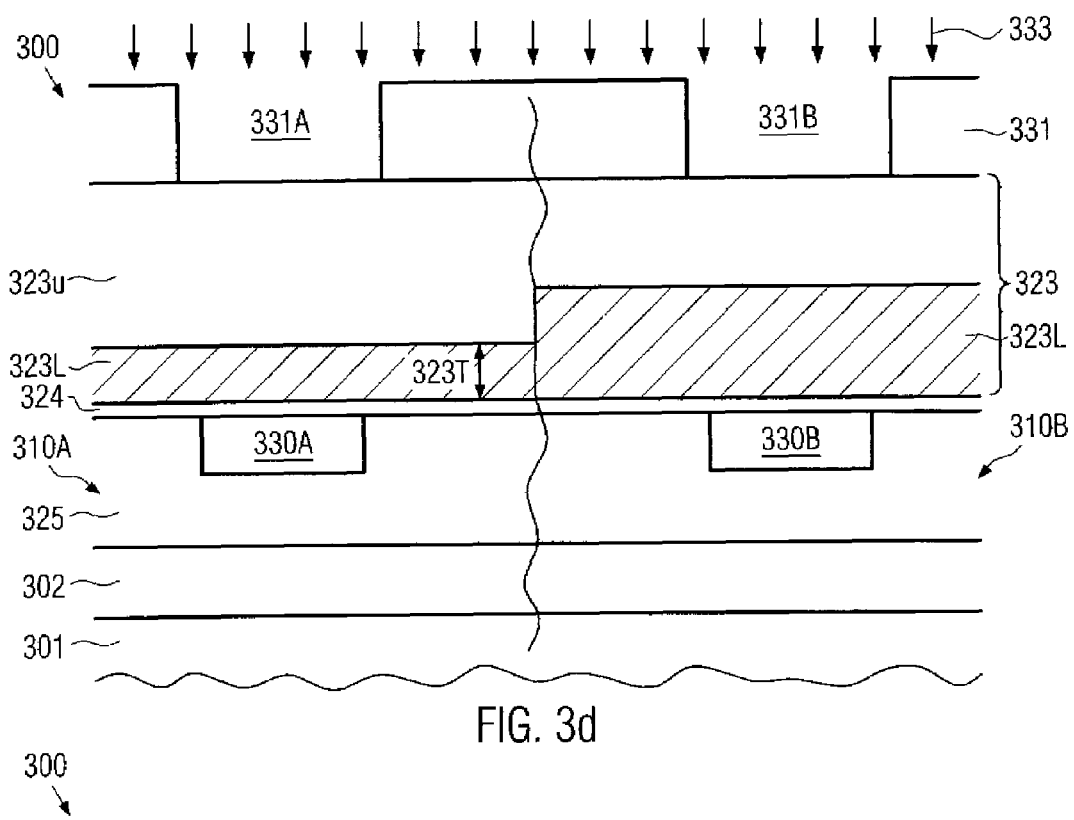

FIG. 3d schematically illustrates the semiconductor device 300 in a further advanced manufacturing stage after the completion of the above-described CMP for planarizing the surface topography. Furthermore, the device 300 may comprise an etch mask 331 including respective trenches 331A, 331B having lateral dimensions in accordance with device and process requirements, as previously explained. Moreover, the device 300 is exposed to an etch process 333 for patterning the first and second sub-layers 323U, 323L, which may commonly define a dielectric layer 323. As is previously explained, the layers 323U, 323L may exhibit different etch characteristics with respect to the process 333, wherein, in the embodiment illustrated, a higher etch rate is assumed for the second sub-layer 323U compared to the first sub-layer 323L. Consequently, during a first phase of the etch process 333, respective trench openings may be formed in the second sub-layer 323U, wherein when the etch front in the second device region 310B arrives at the first sub-layer 323L, the resulting etch progression may be significantly slowed down. In some illustrative embodiments, the material of the layer 323L may even act as an efficient etch stop layer, thereby substantially avoiding undue material removal of the layer 323L, while the etch process in the first device region 310A still continues. After the first sub-layer 323L is also exposed in the first device region 310A, the etch process 333 may be stopped.

Figure 3E:
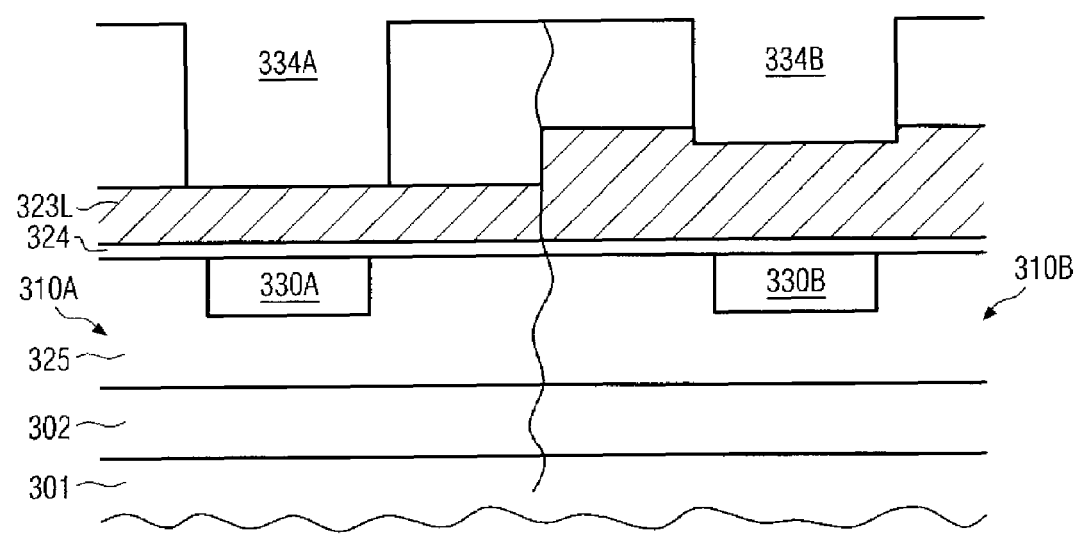

FIG. 3e schematically illustrates the semiconductor device 300 after the etch process 333 and with the etch mask 331 removed. Consequently, a trench 334A having an increased depth is formed in the first device region 310A, while a trench 334B having a reduced depth is provided in the second device region 310B. It should be appreciated that, with respect to any vias, the same criteria apply as previously explained with reference to the device 200. That is, respective vias may have been formed prior to the etch process 333, or may be formed on the basis of the device 300 as shown in FIG. 3e. Thereafter, the further process sequence may be continued as is also described with reference to FIGS. 2d-2e, i.e., an appropriate barrier material, if required, may be deposited and subsequently the respective metal may be filled into the trenches 334A, 334B in a common fill process on the basis of any appropriate deposition technique. Thereafter, any excess material may be removed by electrochemical etching, CMP and the like in order to obtain respective metal lines of different thickness, similarly as is shown in FIG. 2g.

Figure 4:
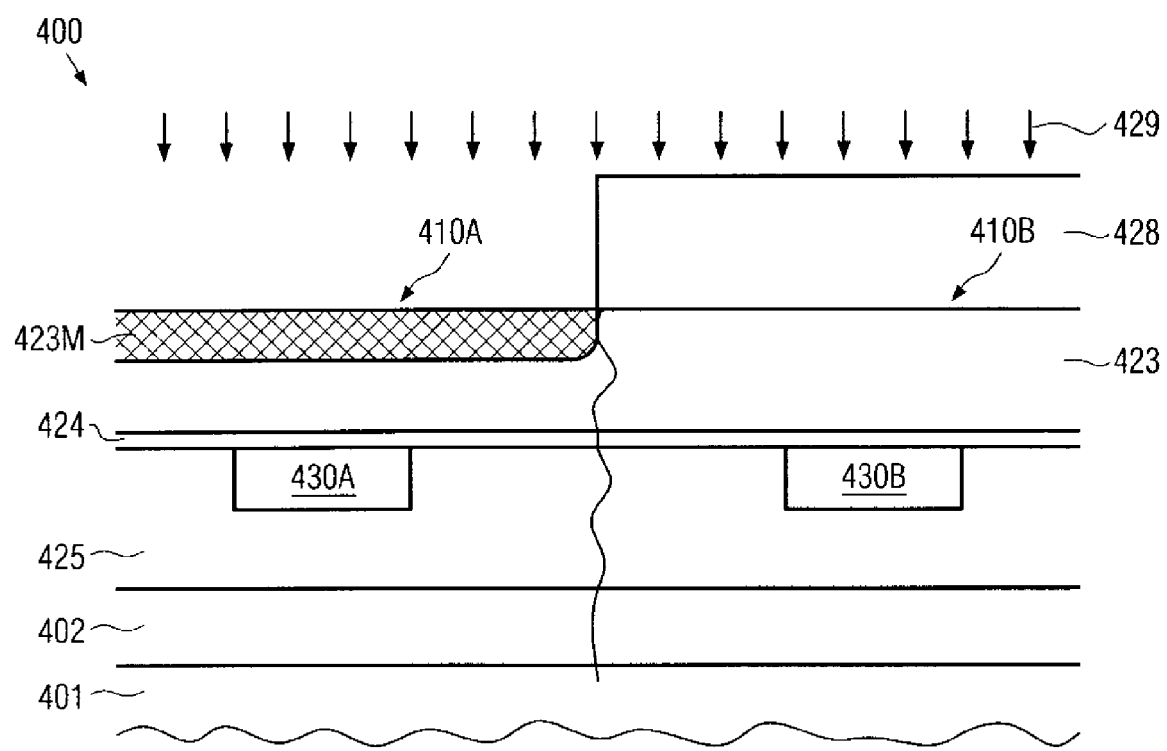
FIG. 4 schematically illustrates a cross-sectional view of a semiconductor device during a manufacturing stage for adjusting the etch behavior in a specific device region for forming trenches of different depths.

FIG. 4 schematically illustrates a semiconductor device 400 according to another illustrative embodiment of the present disclosure, in which etch characteristics of the dielectric layer of a metallization layer are selectively adjusted in order to obtain different etch depths during a common etch process for forming respective trenches for metal lines. The semiconductor device 400 may comprise a substrate 401 having formed thereon a device layer (not shown) followed by a dielectric layer 425 including respective conductive regions 430A, 430B located in respective device regions 410A, 410B. Furthermore, an etch stop layer 424 followed by a dielectric layer 423 may be formed above the conductive regions 430A, 430B. Regarding the respective components 401, 425, 430A, 430B, 424 and 423, the same criteria apply with respect to characteristics and manufacturing techniques as previously discussed with reference to the semiconductor devices 100, 200 and 300. Furthermore, a mask 428 may be provided to expose the first device region 410A, while covering the second device region 410B. The device 400 is subjected to a treatment 429 in order to selectively adjust the etch behavior of the dielectric layer 423 during a subsequent etch process for forming respective trenches for accommodating respective metal lines. In one illustrative embodiment, the treatment 429 may represent an ion implantation on the basis of any appropriate species, such as xenon, krypton and the like, in order to significantly modify the structure of the material in the layer 423, which may result in an increased etch rate with respect to a specified etch recipe. For instance, the ion bombardment of the treatment 429 may result in an appropriately modified area 423M, the dimensions of which may be determined on the basis of the respective implantation parameters, such as process time, exposure dose and energy. Appropriate parameters for the treatment 429 in the form of an ion bombardment may be readily determined on the basis of simulations, experience, test runs and the like. In other illustrative embodiments, the treatment 429 may represent a surface modification process, for instance by applying a nitrogen-based plasma, an oxygen plasma and the like, in order to modify layer portions in the vicinity of the surface of the layer 423, which may result in a corresponding modification of the respective texture, resulting in an increased resistance against a specified etch recipe. Consequently, in this case, the portion 432M may act as a material layer for decelerating a corresponding etch process, thereby producing a reduced thickness of a respective trench to be formed in the first device region 410A.

After the treatment 429, the mask 428 may be removed and the further processing may be continued as previously described, i.e., by providing an appropriately designed etch mask and performing a respective anisotropic etch process for forming respective trenches in the first and second device regions 410A, 410B, wherein the modified portion 423M may result in a reduced or increased etch depth, depending on the type of modification during the treatment 429. For instance, the respective process parameters for the corresponding anisotropic etch process, as well as the respective lateral dimensions of the associated etch mask, may be selected to comply with device and process requirements for any metal trenches in the second device region 410B when an increased line thickness is desired in the first device region 410A. In this case, respective dense trenches may be obtained in the second device region 410B based on well-established process techniques, while trenches of increased thickness may be simultaneously obtained in the region 410A, wherein respective influences of the increased etch rate, such as an increased corner rounding at the top of the respective trenches may be less critical due to relaxed constraints with respect to minimum pitch in the first device region 410A. Similarly, when the first region 410A is to receive trenches of reduced depth, the modified portion 423M may reduce the etch rate, at least for a specified time period, which may also result in an increased etch fidelity for the respective trenches. After the respective etch process, metal may be filled in the trenches as is also described above. As a result, metal lines of different thickness may be obtained with a high degree of compatibility with conventional process flows, wherein a substantially planar surface topography is maintained throughout the entire process flow.

Figure 5A:
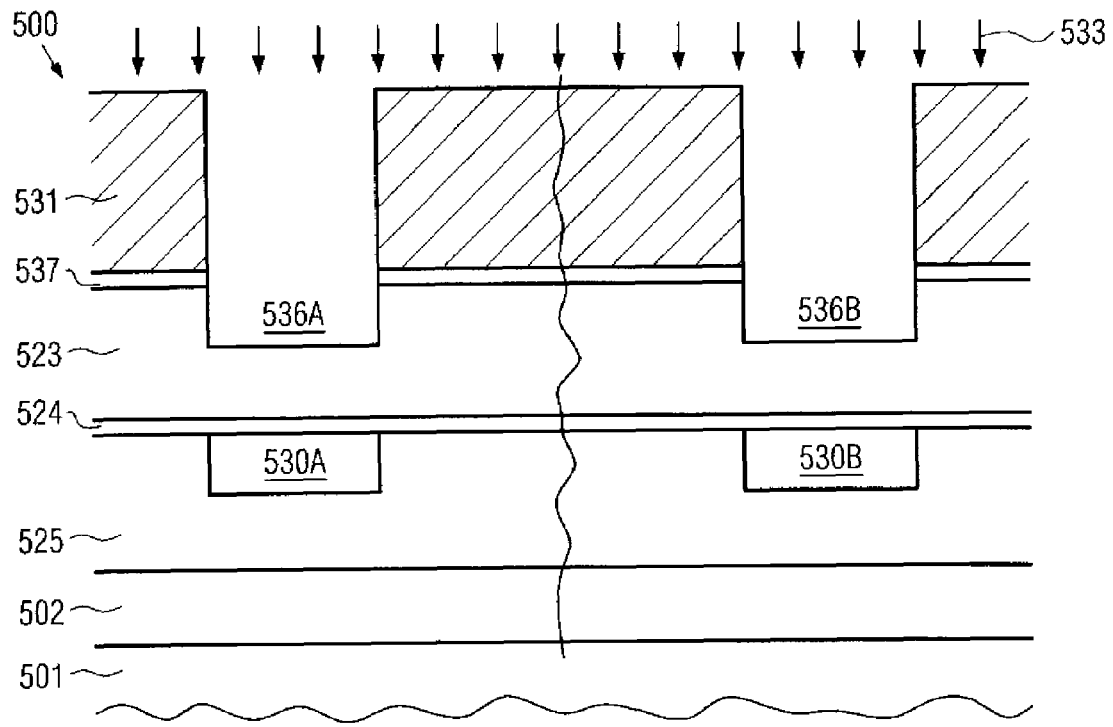
FIGS. 5a-5b schematically illustrate a semiconductor device at various manufacturing stages for forming trenches for metal lines with different depths.
Figure 5B:
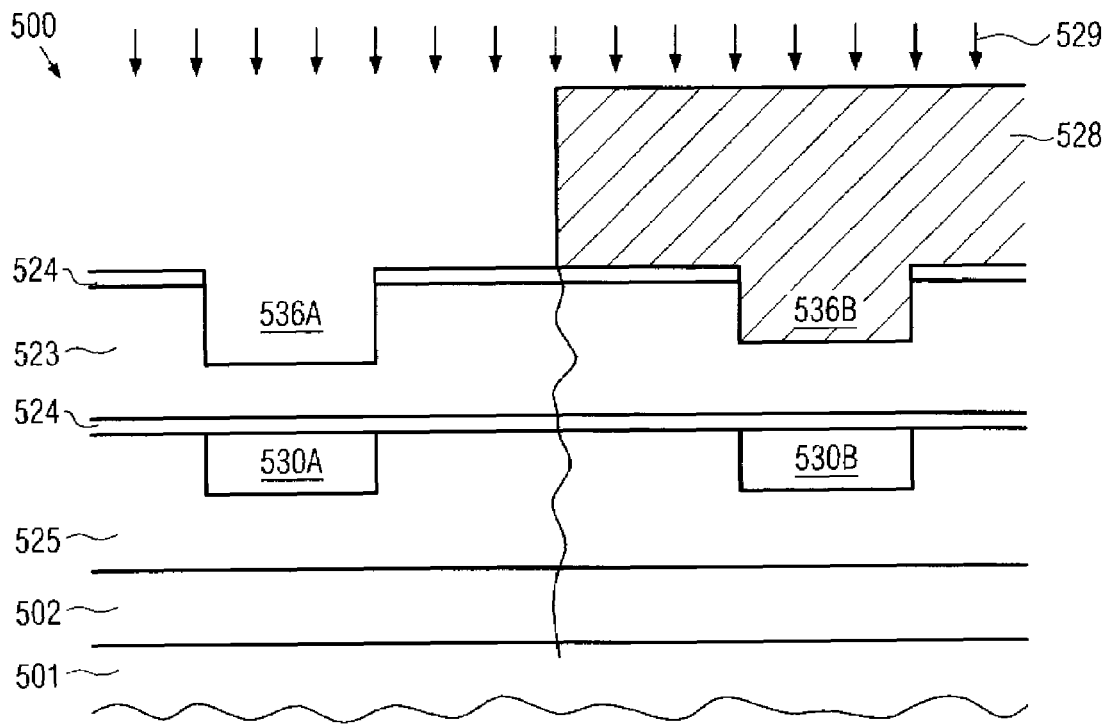

With reference to FIGS. 5a and 5b, further illustrative embodiments will now be described in more detail, in which the surface topography during the patterning of the dielectric layer of the metallization layer is substantially maintained while nevertheless the lines of different thickness are obtained.

In FIG. 5a, a semiconductor device 500 may comprise a substrate 501, above which may be formed a device layer (not shown), respective conductive regions 530A, 530B embedded in a dielectric layer 525 followed by an etch stop layer 524. A dielectric layer 523 may follow, wherein the respective components may have substantially the same characteristics as previously described with reference to the semiconductor devices 100, 200, 300 and 400. Moreover, in this manufacturing stage, the semiconductor device 500 may comprise an etch mask 531, formed above an etch stop layer 537, which may be comprised of any appropriate material that may provide sufficient etch resistivity in a subsequent etch process. Furthermore, the device 500 may be subjected to an anisotropic etch process 533 in order to form respective trench portions 536A, 536B in first and second device regions 510A, 510B on the basis of the etch mask 531. For example, the etch process 533 may be designed such that a desired depth for the trenches in the second device region 510B is achieved. For this purpose, the etch process 533 may comprise a first etch step in order to open the etch stop layer 537 and thereafter a corresponding etch step may follow having characteristics in accordance with process requirements for forming the trenches 536B with a desired depth and lateral dimensions. Thereafter, the etch mask 531 may be removed.

FIG. 5b schematically illustrates the semiconductor device 500 in a further advanced manufacturing stage, in which a further etch mask 528 is formed in order to cover the second device region 510B, while exposing the first device region 510A. Furthermore, a further etch process 529 may be performed, which may, for instance, be performed on the basis of substantially the same recipe as the main etch step of the process 533, wherein the etch stop layer 537 may efficiently protect exposed surface portions of the dielectric layer 523 outside the trench 536A. Consequently, the depth of the trench 536A may be adapted in accordance with device requirements during the process 529, wherein the etch stop layer 537 provides a high degree of etch selectivity or fidelity. Thereafter, the etch mask 528 may be removed and the further processing may be continued by filling in an appropriate metal into the respective trenches 536A, 536B, wherein, in some illustrative embodiments, the etch stop layer 537 may be maintained. Thereafter, any excess material may be removed by electrochemical techniques in combination with CMP, wherein the etch stop layer 537 may also act as an efficient layer for controlling the CMP process. That is, during a first phase of the CMP process, the etch stop layer 537 may impart increased mechanical stability to the dielectric layer 523, when this layer is comprised of a low-k dielectric material. After exposing the etch stop layer 537, the CMP process may be stopped, for example when the dielectric constant of the layer 537 may be acceptable, or, in other illustrative embodiments, in a final step of the CMP process, the etch stop layer 537 may be removed. Consequently, metal lines of different thickness may be obtained with a high degree of compatibility with conventional strategies, wherein the additional etch stop layer 537 may even impart enhanced etch accuracy and enhanced behavior during a final CMP process for removing excess metal after a common metal deposition process.

As a result, the present disclosure provides a technique for the formation of metal lines of different thicknesses in different device regions in order to meet device requirements, such as high line density in one device region, while obtaining a low line resistivity with reduced lateral dimensions in other device regions. For this purpose, in some illustrative embodiments, a dielectric layer of a metallization layer may be patterned so as to have a different thickness in the respective device regions prior to performing a respective etch process, wherein any excess material of the device region of increased height may be removed after a common process for forming trenches and filling the same with metal on the basis of CMP techniques. In other illustrative embodiments, a different material sequence in the depth direction of the dielectric layer may be established, for instance by patterning a first portion of a hybrid dielectric layer stack and providing an upper portion thereof so as to obtain a substantially planar surface configuration, which may then exhibit a different etch behavior in the respective device regions. In still other illustrative embodiments, the etch behavior in the respective device regions may be appropriately adjusted by other treatments, such as a selective surface modification, ion bombardment and the like. Moreover, by providing an additional etch stop layer during the patterning of respective trenches in the dielectric of the metallization layer, respective trenches of different depth may be provided. In other cases, when highly advanced patterning techniques may be used, for instance in the form of nano-imprint techniques, respective differently deep trenches may be obtained by providing a correspondingly adapted nano-stamp. For instance, a respective material of an appropriate viscosity may be used as the dielectric of the metallization layer and may be subsequently patterned by inserting the nano-stamp having the required different height of the respective negative image of the trenches to be formed in the viscous dielectric material. After forming the respective trenches of different depth, the processing may be continued by filling the trenches in a common deposition process, as is also described above. Furthermore, the process technique as described above may be applied to more than two device regions within a single die in order to enhance the flexibility in adapting the line resistivity to the function of the metallization layer in the respective device region.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a first conductive line in a first portion of a dielectric layer located in a first device region of a semiconductor device, the first conductive line having a first target thickness with respect to a top surface of said dielectric layer, and forming a second conductive line having a second target thickness with respect to said top surface of said dielectric layer other than said first target thickness in a second portion of said dielectric layer located in a second device region, wherein forming said first and second conductive lines comprises depositing a conductive material for said first and second conductive lines in a common deposition process.

2. The method of claim 1, wherein forming said first and second conductive lines further comprises forming a first trench in said first portion and forming a second trench in said second portion and filling said first and second trenches in said common deposition process.

3. The method of claim 2, further comprising selectively removing material of said first portion of said dielectric layer prior to forming said first and second trenches.

4. The method of claim 3, wherein said first and second trenches are formed in a common patterning process.

5. The method of claim 4, further comprising reducing a height difference between said first and second device regions by selective material removal after said common deposition process.

6. The method of claim 2, further comprising selectively modifying an etch characteristic in one of said first and second device regions prior to forming said first and second trenches.

7. The method of claim 6, wherein said etch characteristic is modified by selectively forming an etch decelerating layer above said second portion.

8. The method of claim 6, wherein said etch characteristic is modified by selectively increasing an etch rate in said first device region.

9. The method of claim 1, wherein forming said first and second conductive lines further comprises forming a first sub-layer of dielectric material, selectively reducing a thickness of said first sub-layer in said first device region and forming a second sub-layer above said first sub-layer, said first and second sub-layers being a part of said dielectric layer.

10. The method of claim 9, further comprising forming said second sub-layer with excess material and planarizing said second sub-layer.

11. The method of claim 10, wherein said first and second sub-layers have different etch characteristics with respect to an etch process used for forming a first and second trench in said dielectric layer in a common etch process.

12. A method, comprising:
forming a first conductive line in a first portion of a dielectric layer located in a first device region of a semiconductor device, the first conductive line having a first target thickness with respect to a top surface of said dielectric layer, and forming a second conductive line having a second target thickness with respect to said top surface of said dielectric layer other than said first target thickness in a second portion of said dielectric layer located in a second device region, wherein forming said first and second conductive lines comprises forming a first trench in said first device region and a second trench in said second device region in a common etch process.

13. The method of claim 12, wherein forming first and second trenches comprises selectively adjusting etch characteristics in one of the first and second device regions prior to performing said common etch process.

14. The method of claim 12, further comprising filling a metal in said first and second trenches in a common process.

15. The method of claim 12, wherein forming first and second conductive lines comprises patterning said dielectric layer so as to have a reduced thickness in said first device region.

16. The method of claim 12, wherein forming said first and second conductive lines comprises forming a first sub-layer, patterning said first sub-layer so as to have a reduced thickness in said first device region and depositing a second sub-layer, said first and second sub-layers being a part of said dielectric layer.

* * * * *